US006400167B1

(12) United States Patent
Gessford et al.

(10) Patent No.: US 6,400,167 B1
(45) Date of Patent: Jun. 4, 2002

(54) PROBE TIP ADAPTER FOR A MEASUREMENT PROBE

(75) Inventors: Marc A. Gessford, Hillsboro, OR (US); Mark W. Nightingale, Washougal, WA (US); Gary W. Reed, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 68 days.

(21) Appl. No.: 09/668,753

(22) Filed: Sep. 22, 2000

Related U.S. Application Data
(60) Provisional application No. 60/226,723, filed on Aug. 21, 2000.

(51) Int. Cl.$^7$ ................................................ G01R 31/02
(52) U.S. Cl. ...................................... 324/754; 324/72.5
(58) Field of Search .................. 324/72.5, 754–761, 324/73

(56) References Cited

U.S. PATENT DOCUMENTS

| | | | |
|---|---|---|---|
| 4,528,500 A | * 7/1985 | Lightbody et al. | 324/537 |
| 4,739,259 A | * 4/1988 | Hadwin et al. | 324/72.5 |
| D354,923 S | 1/1995 | Nightingale | |
| 5,387,872 A | 2/1995 | Nightingale | |

OTHER PUBLICATIONS

Chomerics Manufacturer, division of Parker Hannifin, Woburn, Massachusetts. Catalog page "Cho–Form Robotically Dispensed Conductive Elastomer Technology", Nov. 1999.

* cited by examiner

Primary Examiner—Michael J. Sherry
Assistant Examiner—Tung X Nguyen
(74) Attorney, Agent, or Firm—William K. Bucher (57) ABSTRACT

A probe tip adapter for a measurement probe has at least a first electrically conductive element with a bore at one end and a probing contact formed on the other end. The bore of the electrically conductive element has an electrically conductive elastomer disposed therein having sufficient tensile strength, compression set, hardness, deflection force, elongation and percent recovery for repeatably securing the electrically conductive element to the probing tip of the measurement probe. An element holder is positionable on the measurement probe and has a cavity formed in one end for receiving the measurement probe. At least a first bore is formed in the other end of the element holder extending to the cavity and aligned with the probing tip of the measurement probe. The electrically conductive element is positioned in the holder bore such that the probing tip penetrates the elastomer and the probing contact extends from the holder. The probing contact may be configured as a probing tip having a shaft that tapers at one end to a point and as a square pin adapter with a bore formed in the electrically conductive element that receives a spring contact. The probe tip adapter is useable with both single ended and differential measurement probes.

20 Claims, 7 Drawing Sheets

PROBE TIP ADAPTER FOR A MEASUREMENT PROBE

CROSS-REFERENCE TO RELATED APPLICATION

This application claims the benefit of the U.S. Provisional Application No. 60/226,723, filed Aug. 21, 2000.

BACKGROUND OF THE INVENTION

The present invention relates generally to probe adapters for measurement probes and more particularly to a probe tip adapter usable with very high frequency single ended and differential measurement probes.

Figure 1:
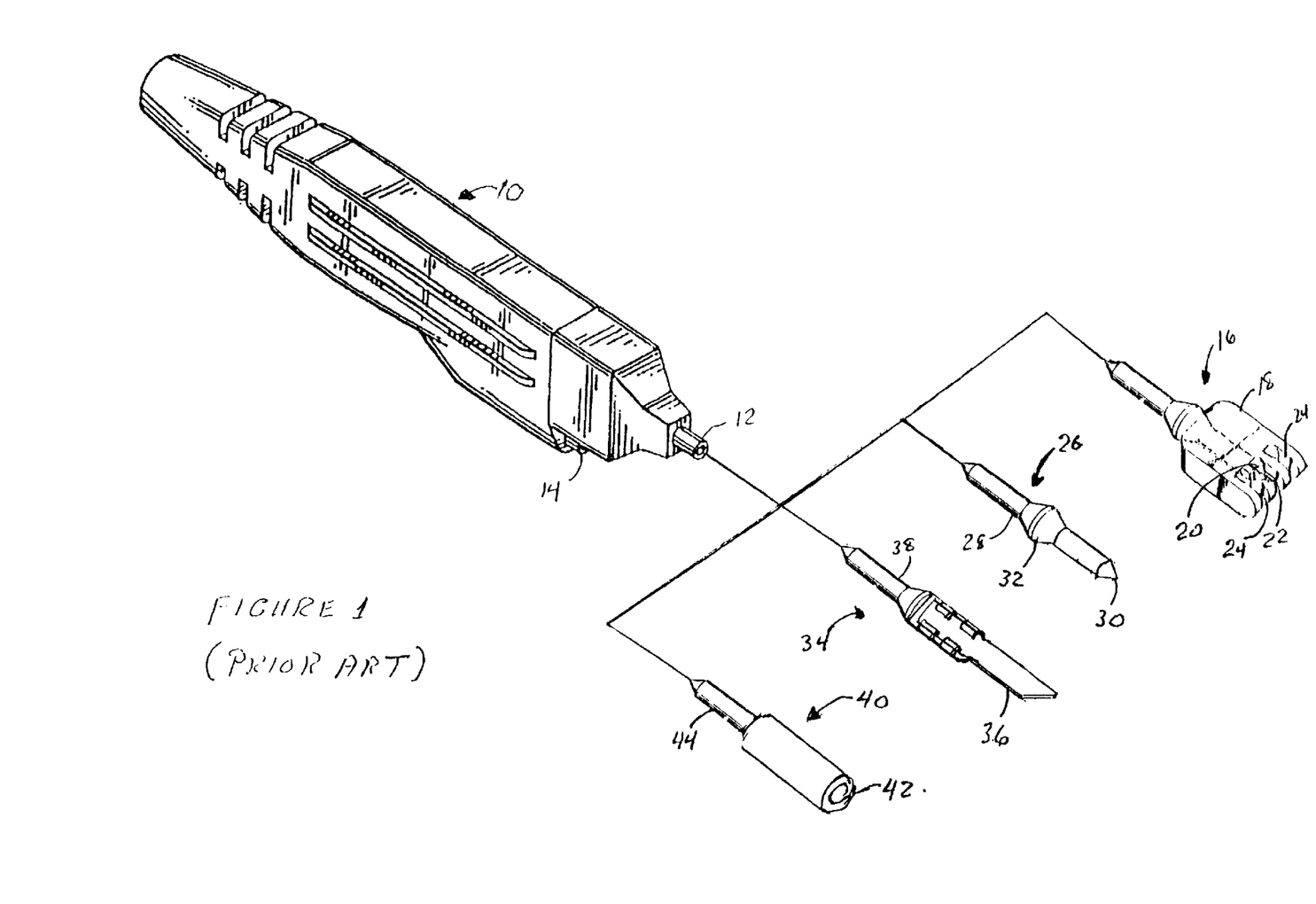
FIG. 1 is a prior art measurement probe having a socket type probe tip and associated probe tip adapters.

Probe tip adapters are accessories developed for measurement probes to allow probing of various types of electrical components. The adapters allow connections to square pins mounted on a circuit board, ground points on the circuit board, leads of surface mounted integrated circuit devices, and the like. The P6243 Active Measurement Probe 10, manufactured and sold by Tektronix, Inc., Beaverton, Oreg. and assignee of the instant invention, has a socket type probe tip 12 and ground socket 14 as shown in FIG. 1 and depicted in design patent DES 354,923. The socket tip has an overall length of 0.255 inches and a diameter of 0.065 inches. The socket bore has a diameter of 0.038 inches and a length of 0.225 inches. Various types of probe Up adapters are inserted into the socket to allow various types of probing.

A positioning aid probe tip adapter 16, described in U.S. Pat. No. 5,387,872, has a housing 18 with a central bore 20 there through that receives a probing tip 22. The housing 18 has teeth formed in one end defining slots 24 that are positionable between the leads of an integrated circuit device. The bore 20 extends into one of these slots 24 with the probing tip 22 exposed therein. The other end of the probing tip 22 extending from the other end of the housing 18 contact shaft for insertion into the socket type probe tip 12. A standard probing tip 26 has a shaft 28 that has one end tapering to a point 30 for probing IC leads, points on a circuit board and the like. The other end of the shaft is inserted into the socket type probe tip 12. The probing tip 26 may also include a cone shaped protrusion 32 formed on the shaft 28 for abutting against the socket type probe tip 12. Adapter 34 is an assembly having a flexible electrically conductive lead 36 attached to an electrical contact shaft 38 that is inserted into the socket type probe tip 12. Adapter 40 has a square pin socket 42 on one end and a contact shaft 44 on the other for inserting into the probe tip 12. The contact shafts for the above described adapters have a length in the range of 0.250 inches.

Figure 2:
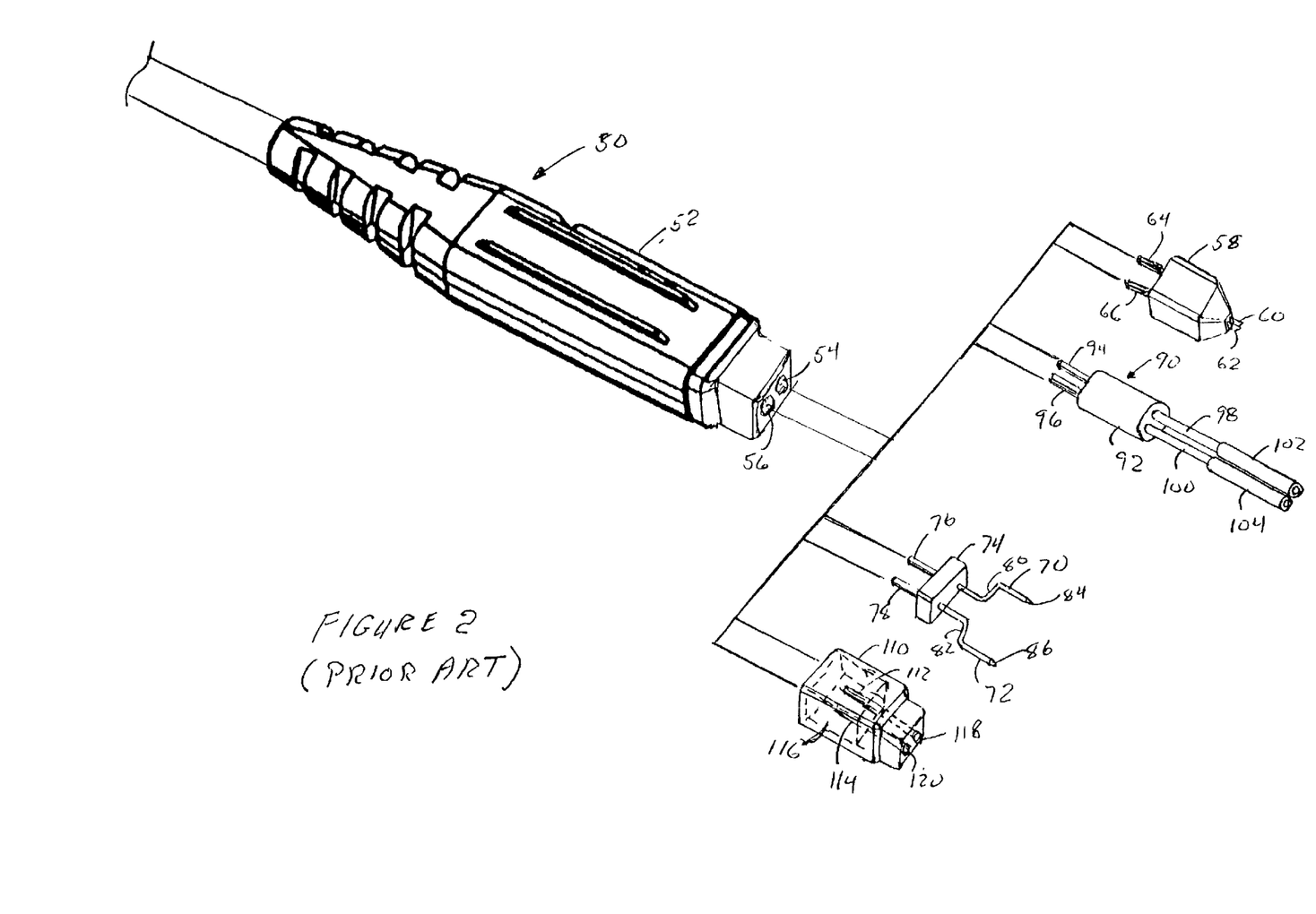
FIG. 2 is a prior art differential measurement probe having socket type probing tips and associated probe tip adapters.

The above described probe tip adapters may also be used with differential type probes, such as the P6246 Differential Probe 50, manufactured and sold by Tektronix, Inc., Beaverton, Oregon, the assignee of the instant invention and shown in FIG. 2. The differential probe 50 has a measurement probe head 52 with dual socket type probing tips 54, 56 extending from the nose of the probe head 52. When used with a differential probe, the adapters are generally ganged together for ease of use. For example, two flexible electrically conductive lead adapters are positioned in a trapezoidal shaped housing 58 with the flexible electrically conductive leads 60, 62 extending from one end of the housing 58 and the contact shafts 64, 66 extending from the other end of the housing. The flexible electrically conductive leads 60, 62 have a pitch geometry compatible with the leads of surface mounted integrated circuit devices and the contact shafts 64, 66 have a pitch geometry compatible with the socket type probe tips 54, 56 of the measurement probe head 52. Such a probe tip adapter is described in co-pending patent application Ser. No. 08/738,861, filed Oct. 26, 1996 and assigned to the assignee of the instant invention. Offset probing tips 70, 72 are ganged together with an insulating material 74, such as plastic, having bores formed therein that receives the probing tips 70, 72. The bores have a center to center spacing or pitch geometry that provides the contact shafts 76, 78 with a pitch geometry compatible with the socket type probing tips 54, 56. The respective probing tips 70, 72 have bends 80, 82 formed in them to offset the probing tips 84, 86 to allow the probing tips to match various pitch geometries of surface mounted integrated circuit devices. Each offset probing tip 70, 72 may be secured in the insulating material 74 by forming outwardly extending rib on the probing tip shaft that engage the interior surface of the bore in the insulating material 74 into which it is inserted. Alternately, each probing tips 70, 72 may be provided with a small keeper that is slid onto the probing tips after the probe is inserted into the insulating member 74 and abuts the insulating material 74. The keepers are frictionally held in place of the probing tips. The offset probing tips 70, 72 may also be rotatable within the insulating material 74 to allow the pitch geometry of the probing tip to be changed to match the pitch geometry of the integrated circuit device. The differential square pin adapter 90 has a housing 92 having contact shafts 94, 96 extending from one end that are compatible with the pitch geometry of the differential probe tips 54, 56. Extending from the other end of the housing 92 are wires 98, 100 that are attached to the square pin sockets 102, 104. The differential probe also has a tip saver adapter 110 that fits over the nose of the differential probe head 52. The tip saver 110 has contact shafts 112, 114 extending into a cavity 116 formed in the tip saver 110. The nose of the measurement probe head fits into the tip saver cavity 116 with the contact shafts 112, 114 being inserted into the socket type probe tips 54, 56 of the probe head. Each contact shaft is connected to socket type probe tip 118, 120 that are identical to the probe tip sockets of the measurement probe head. This adapter 110 prevents excessive wear and damage to the socket type probe tips 54, 56 of the probe head. Excessive wear and damage to the socket type probe tips of the measurement probe head requires the replacement of the head.

Probe tip capacitance and inductance are major drawback to using socket type probe tip or tips in measurement probes. Tip capacitance and inductance limits the input bandwidth of the probe. With the electronic industry continuing to develop integrated and hybrid circuits operating at higher and higher frequencies, a new type of measurement probe design is required that has substantially reduced probe tip capacitance and inductance. This requires reducing the probe tip length and diameter. Likewise, probe tip adapters are required for these low capacitance measurement probes that have reduced length and diameter. Such probe tip adapters of necessity need to be very small in size. However, such small size adapters could be easily lost.

What is needed is a probe tip adapter that is compatible with a low capacitance measurement probe. The adapter should be adaptable to various types of configurations while minimizing as much as possible additional probe tip capacitance and inductance by reducing the length and diameter of the adapters. The adapter should also be attachable to the low capacitance probe tip of the probe over repeated cycles without losing physical or electrical connectivity. Further, the probe tip adapter should have some form of holder to prevent the loss of the adapters due to their small size.

SUMMARY OF THE INVENTION

Accordingly, the present invention is to a probe tip adapter for a measurement probe wherein the probe has at least a first probing tip extending from the measurement probe. The probe tip adapter has at least a first electrically conductive element with a bore at one end and a probing contact formed on the other end. Disposed in the bore of the electrically conductive element is an electrically conductive elastomer having sufficient tensile strength, compression set, hardness, deflection force, elongation and percent recovery for repeatably securing the electrically conductive element to the probing tip of the measurement probe. An element holder is positionable on the measurement probe and has a cavity formed in one end for receiving the measurement probe. At least a first bore is formed in the other end of the element holder that extends to the cavity and is aligned with the probing tip of the measurement probe. The electrically conductive element is positioned in the holder bore such that the probing tip penetrates the elastomer and the probing contact extends from the holder.

The electrically conductive element is preferably machined as a single part with a first portion associated with the bore end of the element and a second portion associated with the probing contact end of the element. Each portion has a perimeter with the perimeter of the first portion being smaller than the perimeter of the second portion forming an outward extending shoulder from the first portion for abutting against the holder. Alternately, the electrically conductive element may be formed with a first electrically conductive member associated with the bore end of the element and a second electrically conductive member associated with the probing contact end of the element that are joined together. Each member has a perimeter with the perimeter of the first member being smaller than the perimeter of the second member to form an outwardly extending shoulder from the first member for abutting against the holder.

The probing contact of the second portion or member may be configured with a shaft that tapers at one end to a point and the other end that forms a cone extending outward from the shaft having a perimeter larger than the perimeter of the first portion. The shaft of the probing contact may further be angled. The second portion of the probing contact may also be configured with a bore formed therein that receives a spring contact where the probing contact bore and the spring contact are dimensioned to receive a 0.025 inch square pin. The electrically conductive element preferably has an outwardly extending rib formed on the bore end of the element that engages the bore of the holder. The element holder includes a mechanical attachment facility including at least a first pair of nesting detent elements disposed in the cavity and in the measurement probe with one of the nesting detent elements formed in the cavity and the other of the nesting detent elements formed on the measurement probe. The nesting detent elements may be configured as a knob and a depression, a rib and a channel or the like.

The probe tip adapter is usable with both a single ended measurement probe and a differential measurement probe. When used with a differential probe, probe tip adapter has a second electrically conductive element with electrically conductive elastomer disposed in the bore. The element holder has a second bore formed therein extending to the cavity and aligned with the second probing tip of the differential probe. The second electrically conductive element is positioned in the second holder bore such that the second probing Up penetrates the elastomer of the second electrically conductive element and the probing contact of the second element extends from the holder. The angled probe tips of the electrically conductive elements may also be laterally movable from at least a first position having a first pitch geometry to a second position having a second pitch geometry.

The objects, advantages and novel features of the present invention are apparent from the following detailed description when read in conjunction with appended claims and attached drawings.

DETAILED DESCRIPTION OF THE PREFERRED EMBODIMENT

Figure 3:
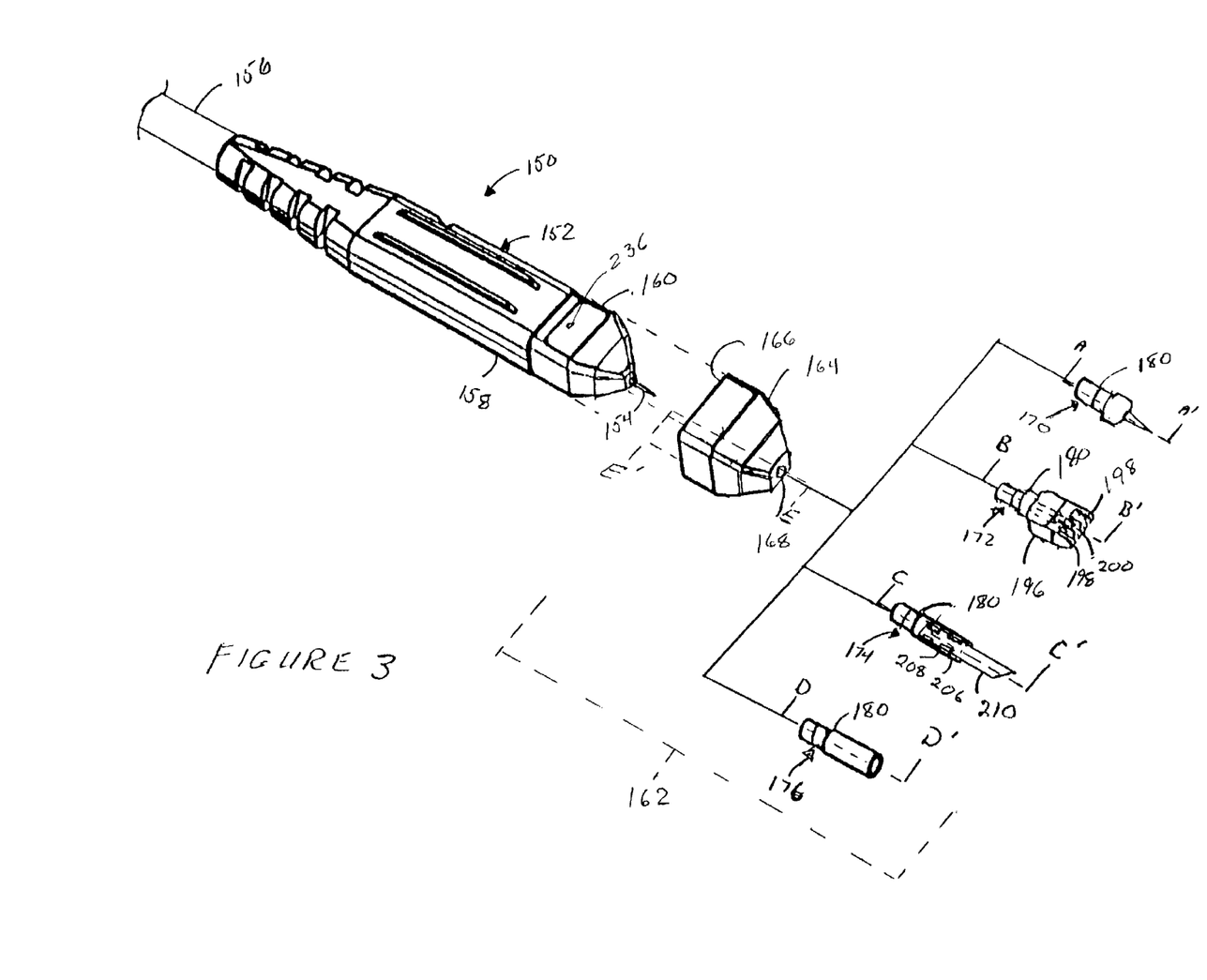
FIG. 3 is a perspective view of a measurement probe usable with various implementations of the probe tip adapter according to the present invention.

Referring to FIG. 3, there is shown a perspective view of a wide bandwidth, high frequency measurement probe 150 designed for probing high bandwidth circuits. The measurement probe 150 has a probe head 152 with a probing tip 154 extending from one end thereof. A coaxial cable 156 extends from the other end to connect the probe head 152 to a measurement instrument, such as an oscilloscope, spectrum analyzer, logic analyzer and the like. The probe head 152 has an electrically conductive tubular housing 158 in which is contained a substrate. Active and passive components are mounted on the substrate to form probe input circuitry. The probing tip 154 and the coaxial cable 156 are electrically connected to the substrate. Insulating material surrounds the tubular housing 158 and a portion of the coaxial cable 156.

To achieve a wide bandwidth and gigahertz frequency range, the probe tip capacitance and inductance needs to be kept to a minimum. To accomplish this, the length and diameter of the probing tip 154 is minimized to the extent possible. Further, the substrate extends out past the end of the tubular housing 158 to minimize the stray capacitance between the substrate and the tubular housing at the probe input. A probe tip holder 160 is connected to the end of the tubular housing and has a cavity that receives the substrate. A bore is formed in the holder 160 to receive the probing tip 154 such that one end of the probing tip extends from the holder 160 and the other end contacts the substrate. The bore has a diameter in the range of 0.019 inches and a length in the range of 0.060 inches. The probing tip has a diameter of approximately 0.018 inches and an overall length in the range of 0.204 inches with the probing tip extending from the end of the holder 160 in the range of 0.107 inches. The measurement probe head 152 and the probe tip holder 160 are described in co-pending patent application Ser. No. 09/607,574, filed Jun. 29, 2000 and assigned to the assignee of the instant invention.

The probe tip adapter 162 of the present invention has a non-conductive holder 164 having a cavity 166 at one end and a bore 168 extending from the cavity 166 to the opposite end of the holder 164. The holder is positionable over the nose of the measurement probe head 152 with the bore 168 aligned with the probing tip 154 of the probe head 152. Any number of adapter elements, as representatively shown by probe adapter elements 170, 172, 174 and 176 may be configured with the holder 164 to form the probe tip adapter 162 of the present invention. Referring to probe point adapter element 170 as an example and to the side sectional view of FIG. 4A, the adapter element 170 has an electrically conductive element 180 having a bore 182 formed in one end and a probing contact 184, formed on the other end. Preferably, a bevel 183 is formed at the bore opening to aid in placement of the element 180 onto the probing tip 154. In the specific example, the probing contact 184 has a shaft 186 that tapers to a point 188. The probing contact 184 end of the element 180 has a perimeter that is greater than the perimeter of the bore 182 end of the element 180 forming an outwardly extending shoulder 190 on the outside of the element 180 adjacent to the distal end of the bore 182. A outwardly extending 192 rib is also formed on the outside of the element 180 adjacent to the approximate midpoint of the bore 182. The rib is provided to secure the probe point adapter element 170 in the holder 164. The shoulder 190 is provided to limit the insertion depth of the adapter element 170 in the holder 164 by the shoulder 190 abutting against the holder 164. The electrically conductive element 180 has an overall length of approximately 0.235 inches. The outside diameter of the bore end of the electrically conductive element 180 is approximately 0.060 inches and the diameter of the bore 182 is approximately 0.040 inches. The bore 182 has an approximate depth of 0.115 inches. The diameter of the shoulder 190 is approximately 0.072 inches and the rib 192 has a diameter of 0.064 inches. The rib is positioned approximately 0.040 inches from the bore 182 opening. The probe contact shaft 186 has a diameter of approximately 0.018 inches and an overall length to the tip of approximately 0.100 inches.

Figure 4A:
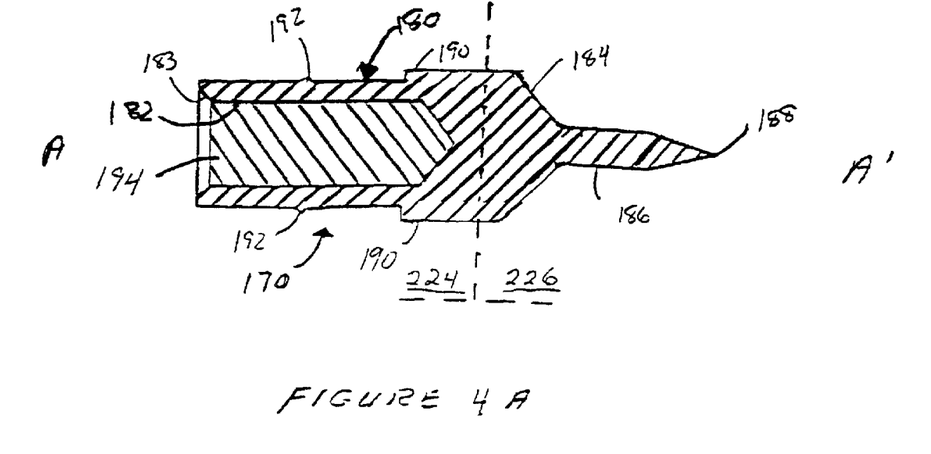
FIGS. 4A–4D are side sectional views along sectional lines A–A', B–B', C–C' and D–D' in FIG. 3 of representative various probe tip elements usable in the probe tip adapter according to the present invention.

Disposed in the bore 182 is an electrically conductive elastomer 194 that secures the probe point adapter element 170 to the probing tip 154 of the measurement probe 150. The electrically conductive elastomer 194 has specific properties, such as tensile strength, compression set, hardness, deflection force, elongation, percent recovery and the like that allow the probe tip adapter 162 to be repeatably secured to the probe tip 154. Preferably the elastomer 194 has a tensile strength in the range of 300 PSI or 2.07 Mpa., a maximum compression set of 25%, a hardness in the range of 45 Shores, a 25% deflection force in the range of 4 lb/in or 0.71 kg/cm and a 50% deflection force in the range of 12 lb/in or 2.14 kg/cm, and elongation in the range of 250%. The compression set is expressed as a percentage of deflection at 25% deflection. Percent recovery is determined from the compression set as one-fourth of the compression set value subtracted from 100%. For a compression set of 25% the recovery percent is 93.75%. A silver-copper conductive filler is preferably used in the elastomer having a volume resistivity in the range of 0.008 ohm/cm. An example of an electrically conductive elastomer that meets the above described properties is Cho-Form 2.1, manufactured and sold by Chomerics, a Division of Parker Hannifin, Wobum, Massachusetts. Other types of electrically conductive elastomers having similar properties may be used without departing from the scope of the present invention.

Figure 4B:
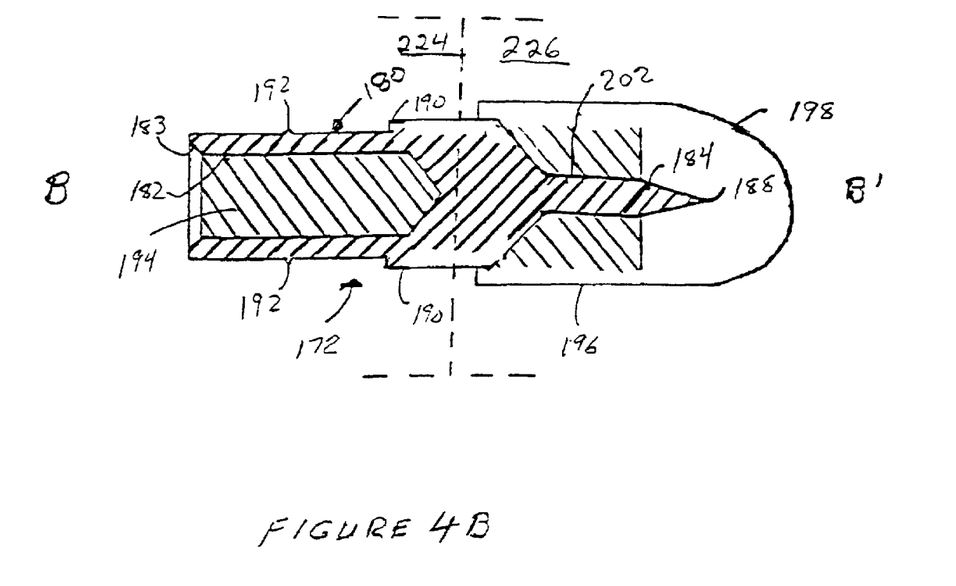

FIG. 4B shows a side sectional view along sectional line B–B' in FIG. 3 of a positioning aid adapter element 172. The electrical conductive element 180 of the positioning aid adapter element 172 has the basic structural elements and dimensions of the probe point adapter element 170. The electrically conductive element 180 has a beveled bore 182 at one end and a tapered probing contact 84 formed on the other end. The bore 182 is filled with the electrically conductive elastomer 194 as previously described. A shoulder 190 and rib 192 are formed on the outer surface of the element 180 as previously described. A nonconductive housing 196 has teeth 198 formed in one end thereof defining slots 200 with the teeth 198 being positioned between the leads of an integrated circuit device. A bore 202 is formed in the housing that extends from one of the slots 200 to the opposite end of the housing 196. The tapered probing contact 184 of the electrically conductive element 180 is positioned in the bore 202 with probing tip 188 extending into the slot 200. The bore end of the electrically conductive element 180 extends outward from the housing 196 for positioning on the probe tip 154.

Figure 4C:
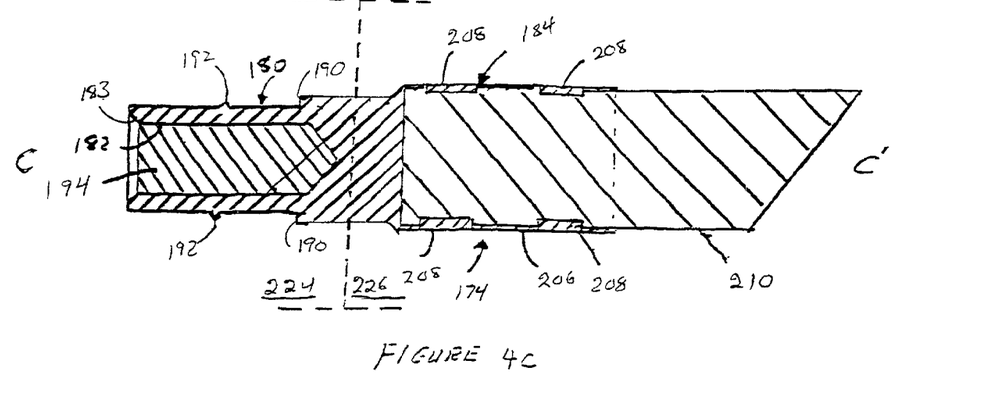

FIG. 4C shows a side sectional view along sectional line C–C' in FIG. 3 of a flexible lead adapter element 174. The flexible lead adapter element 174 has an electrical conductive element 180 with a structurally similar and dimensioned beveled bore 182 at one end. The bore 182 is filled with the electrically conductive elastomer 194 as previously described. A shoulder 190 and rib 192 are formed on the outer surface of the element 180 having the dimensions previously described. A portion of the probing contact 184 of the electrically conductive element 180 is modified to have a flat portion 206 with tapered fingers 208 extending upward from the flat portion 206. A flexible electrically conductive lead 210 is positioned on the flat portion 206 with the tapered fingers 208 being crimped onto the flexible electrically conductive lead 210 to secure the lead to the flat portion 206.

Figure 4D:
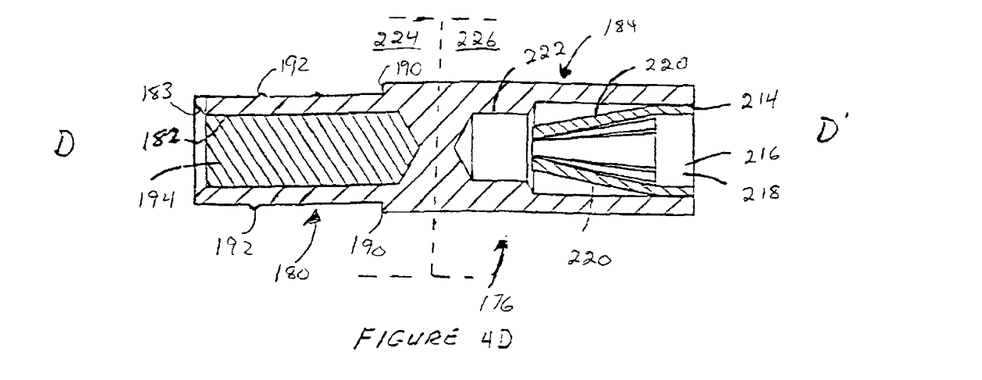

FIG. 4D shows a side sectional view along sectional line D–D'in FIG. 3 of a square pin adapter element 176. The square pin adapter element 176 has an electrical conductive element 180 with a structurally similar beveled bore 182 at one end. The bore 182 is filled with the electrically conductive elastomer 194 as previously described. A shoulder 190 and rib 192 are formed on the outer surface of the element 180 having the dimensions previously described. The probe contact end 184 has a bore 214 formed therein having a diameter that receives a spring contact 216. The spring contact 216 may be formed with a circular ring 218 and inwardly disposed flexible finger 220 extending from the ring 218. A second bore 222 having a diameter smaller than the first bore is formed adjacent to the first bore and is sized to receive a square pin. In the preferred embodiment, the bores 214 and 222 and the spring contact 216 are dimensioned to receive a 0.025 inch square pin. The electrically conductive element 180 has an overall length of approximately 0.270 inches. The contact end of the element 180 has an approximate diameter of 0.072 inches and the bore 214 has a diameter of approximately 0.051 inches and a depth of approximately 0.089 inches. The bore 222 has a diameter of approximately 0.037 inches and an approximate length of 0.046 inches for a combined overall length of the two bores of approximately 0.135 inches. An example of such a spring contact is manufactured by Mill-Max, Inc., Oyster Bay, New York, under part number contact #47. The bores 214 and 222 and the spring contact 216 are not limited to dimensions for a 0.025 square pin and other bore and spring contact dimensions may be used for different sized spring contacts with departing from the scope of the invention.

The electrically conductive element 180 is preferably machined from an electrically conductive blank made of brass, beryllium copper or similar type electrically conductive material. The bore 182 is machined into one end of the blank. The other end of the blank is machined to form the probing contact end of the electrically conductive element 180. The blank is turned on a lathe or similar type of machinery, such as a grinder, to form the probing contact for the probe point probe tip adapter 170. For the flexible electrically conductive lead probe tip adapter 174, the probe contact end 184 of the blank is stamped to form:the flat portion 206 and the tapered fingers 208. For the square pin probe tip adapter 176, the blank is turned on a lathe or similar type machinery to remove material at the bore end 182 of the blank. The probe contact 184 end is bored to receive the spring contact 216. The blank is heat treated depending on the type of material. For example, the square pin probe tip adapter. blank may be formed of brass, which has sufficient hardness and does not benefit from heat treating. On the other hand, a blank formed of beryllium copper requiring heat treating to increase the hardness. The electrically conductive element blank is gold plated over and plated layer of sulfamate nickel. Alternatively, the electrically conductive element 180 may be formed of first and second electrically conductive members 224 and 226 as shown in the side sectional view drawings. The first electrically conductive member 224 is associated with the bore 182 end of the electrically conductive element 180 and the second conductive member 226 is associated with the probe contact end 184 of the electrically conductive element 180. The first conductive member 224 has a perimeter smaller than the perimeter of the second conductive member 226. The electrically conductive members 224 and 226 are heat treated and plated as previously described and joined together using well known joining techniques, such as brazing, gluing with an electrically conductive adhesive or the like, to produce the various probe tip adapters. The joining of the different perimeter sized members produces the outwardly extending shoulder 190 on the electrically conductive element.

Figure 5:
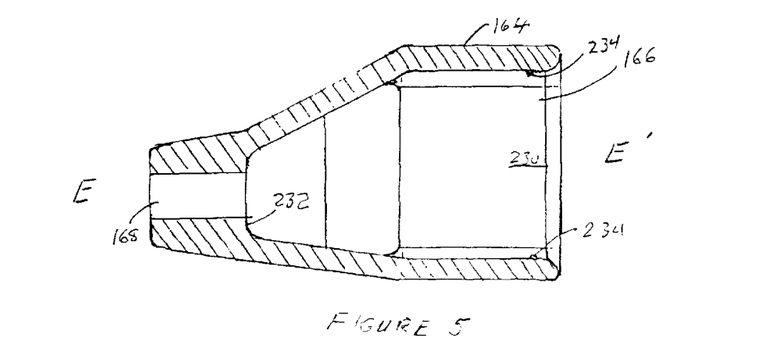
FIG. 5 is a side sectional view along sectional line E–E' in FIG. 3 of the probe tip element holder of the probe tip adapter according to the present invention.

Referring to FIG. 5, there is shown a side sectional view along line E–E'of the adapter element holder 164. The holder has an overall length of approximately 0.440 inches, a width of approximately 0.370 inches and a height of approximately 0.260 inches. The cavity 166 has an overall depth of approximately 0.345 inches with the bore 168 having a length of approximately 0.095 inches and a diameter of approximately 0.062 inches. The cavity 166 width at the opening 230 is approximately 0.300 inches with a height of approximately 0.190 inches. The distance to where the cavity 166 starts to neck down is approximately 0.185 inches. The end face 232 of the cavity 166 at the bore 168 interface has a width of approximately 0.080 inches and a height of approximately 0.084 inches. The holder 164 is dimensioned to have a friction fit the nose of the probe tip holder 160 of the measurement probe head 152. Various type of nesting detent elements, shown as 234 in the element holder 164, and 236 on the probe tip holder, may be included to provide a positive latching of the element holder 164 to the probe tip holder 160. In one configuration, the element holder has opposing knobs 234 formed on the inside of the cavity 166 near the opening 230. Corresponding depressions 236 are formed in the, probe tip holder 160 that receive the knobs 234 when the element holder 164 is place on the probe tip holder 160. In another configuration, the detent elements are opposing ribs in the holder cavity 166 and slots in the probe tip holder 160. It should be understood that the knobs or ribs may be placed on the probe tip holder 160 and the depressions or slots may be placed in the element holder cavity 166.

Figure 6:
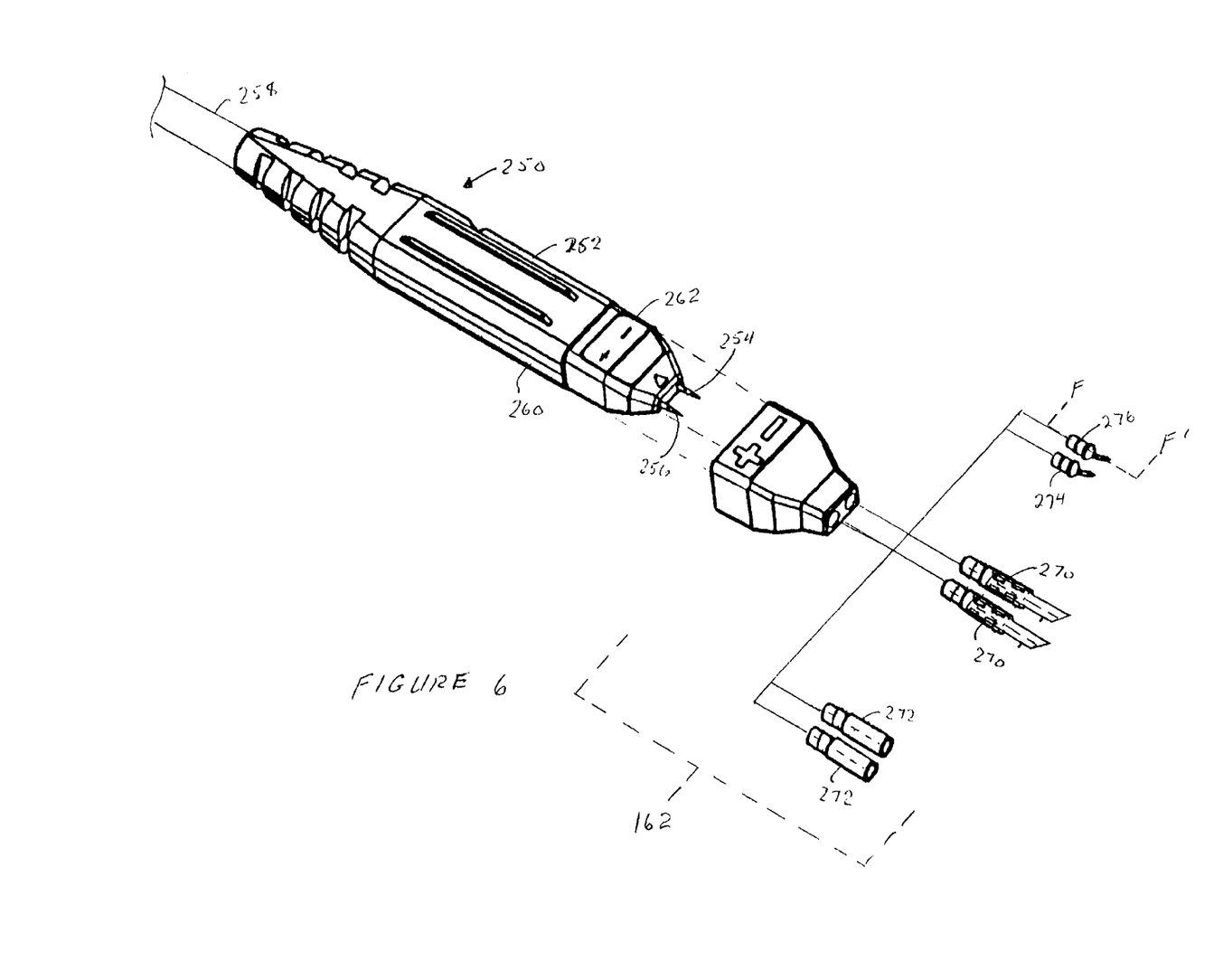
FIG. 6 is a perspective view of a differential measurement probe usable with the various implementations of the probe tip adapter according to the present invention

Referring to FIG. 6, there is shown a perspective view of a wide bandwidth, high frequency differential measurement probe 250 having similar design features to the measurement probe 150 of FIG. 2. The differential measurement probe 250 has a probe head 262 with first and second probing tips 254 and 256 extending from one end thereof. A coaxial cable 258 extends from the other end to connect the probe head to a measurement instrument, such as an oscilloscope, spectrum analyzer, logic analyzer and the like. The probe head 252 has an electrically conductive tubular housing 260 in which is contained a substrate. Active and passive components are mounted on the substrate to form probe input circuitry. The probing tips 254 and 256 and the coaxial cable 258 are electrically connected to the substrate. Insulating material surrounds the tubular housing 260 and a portion of the coaxial cable 258. A probe tip holder 262 is connected to the end of the tubular housing and has a cavity that receives the substrate. First and second bores are formed in the holder to receive the probing tips 254 and 256 such that ends of the probing tips extends from the housing and the other ends contact the substrate. The bores have a diameter in the range of 0.019 inches and a length in the range of 0.060 inches as previously described with a center to center spacing between the bores of 0.100 inches. The probing tips have the same overall diameter and length as the probing tip previously described and extend from the end of the holder the same distance as previously described.

Figure 7:
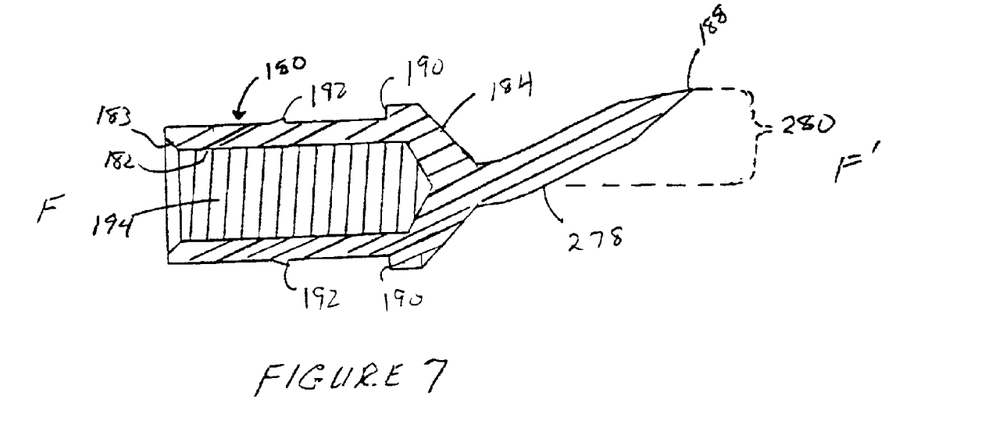
FIG. 7 is a side sectional view along sectional line F–F' of angled probing tip element usable in the probe tip adapter according to the present invention.

The square pin and flexible electrically conductive lead adapter elements 270 and 272 are of the same design as previously described for adapter elements 174 and 176. The probe point adapter element 170 of FIG. 3 has been modified to angled probe point adapter elements 274 and 276, shown in more detail in the cross sectional view along sectional line F–F'of FIG. 7. The angled probe point adapter elements 274 and 276 each have an electrically conductive element 180 with a beveled bore 182 formed in one end. Electrically conductive elastomer 194, such as previously described is disposed in the bore 182. A shoulder 190 and rib 192 are formed on the outer surface of the element 180 as previously described probe tip element 170. The probe contact end 184 of the electrically conductive element 180 has an angled shaft 278 extending from the bore 182 end of the electrically conductive element 180. In the preferred embodiment, the deflection distance of the probing tip 188 from the center line of the element 180 is approximately 0.040 inches as represented by dimension length 280. The deflection distance of the angled probe point adapter elements 274 and 276 allows the probe tips 188 to laterally rotate about the probing tips 254 and 256 to establish various pitch geometries between the probe tips 188 for probing points or devices with differing lead pitch geometries.

A probe tip adapter for a measurement probe has been described having an electrically conductive element with a bore at one end and a probing contact formed on the other end. An electrically conductive elastomer is disposed in the bore of the electrically conductive element that has sufficient tensile strength, compression set, hardness, deflection force, elongation and percent recovery for repeatably securing the electrically conductive element to the probing tip of the measurement probe. An element holder is positionable on the measurement probe and has a cavity formed in one end for receiving the measurement probe. At least a first bore formed in the other end of the element holder extending to the cavity and aligned with the probing tip of the measurement probe. The electrically conductive element is positioned in the holder bore such that the probing tip penetrates the elastomer and the probing contact extends from the holder. The electrically conductive element is preferably machined as a single part with a first portion associated with the bore end of the element and a second portion associated with the probing contact end of the element. Each portion has a perimeter with the perimeter of the first portion being smaller than the perimeter of the second portion forming an outward extending shoulder from the first portion for abutting against the holder. Alternatively, the electrically conductive element may be formed of a first electrically conductive member associated with the bore end of the element having a perimeter smaller than the perimeter of a second electrically conductive member associated with the probing contact end of the element. The first and second members being joined together producing the outwardly extending shoulder. The probing contact may be configured as a probing tip having a shaft that tapers at one end to a point or as a bore formed in the electrically conductive element that receives a spring contact compatible with 0.025 inch square pins. Different configurations of the probing contact are envisioned with one configuration having the shaft of the probing tip being angled and rotatable to configure the probe tip separation for different integrate circuit lead pitch geometries. The probe tip adapter is usable with both single ended and differential measurement probes.

It will be obvious to those having skill in the art that many changes may be made to the details of the above-described embodiments of this invention without departing from the underlying principles thereof. The scope of the present invention should, therefore, be determined only by the following claims.

What is claimed is:

1. A probe tip adapter for a measurement probe wherein the probe has at least a first probing tip extending from the measurement probe comprising:

at least a first electrically conductive element having a bore at one end and a probing contact formed on the other end;

an electrically conductive elastomer disposed in the bore of the electrically conductive element having sufficient tensile strength, compress set, hardness, deflection force, elongation and percent recovery for repeatably securing the electrically conductive element to the probing tip of the measurement probe; and an element holder positionable on the measurement probe having a cavity formed in one end that receives the measurement probe and at least a first bore formed in the other end extending to the cavity and aligned with the probing tip with the electrically conductive element positioned in the holder bore such that the probing tip penetrates the elastomer and the probing contact extends from the holder.

2. The probe tip adapter as recited in claim 1 wherein the electrically conductive element further comprise a first portion associated with the bore end of the element and a second portion associated with the probing contact end of the element with each portion having a perimeter with the perimeter of the first portion being smaller than the perimeter of the second portion forming an outward extending shoulder from the first portion for abutting against the holder.

3. The probe tip adapter as recited in claim 2 wherein the second portion of the probing contact comprises a probing tip having a shaft that tapers at one end to a point and the other end that forms a cone extending outward from the shaft having a perimeter larger than the perimeter of the first portion.

4. The probe tip adapter as recited in claim 3 wherein the shaft of the probing tip is angled.

5. The probe Up adapter as recited in claim 2 wherein the second portion of the probing contact has a bore formed therein that receives a spring contact.

6. The probe tip adapter as recited in claim 5 wherein the probing contact bore and the spring contact are dimensioned to receive a 0.025 inch square pin.

7. The probe tip adapter as recited in claim 1 wherein the electrically conductive element further comprises a first electrically conductive member associated with the bore end of the element and a second electrically conductive member associated with the probing contact end of the element with each member having a perimeter with the perimeter of the first member being smaller than the perimeter of the second member with the first and second members being joined together to form an outwardly extending shoulder from the first member for abutting against the holder.

8. The probe tip adapter as recited in claim 7 wherein the second member further comprises a probing tip having a shaft that tapers at one end to a point and the other end that forms a cone extending outward from the shaft having a perimeter larger than the perimeter of the first member.

9. The probe tip adapter as recited in claim 8 wherein the shaft of the probing tip is angled.

10. The probe tip adapter as recited in claim 7 wherein the second member has a bore formed therein that receives a spring contact.

11. The probe tip adapter as recited in claim 10 wherein the second member bore and the spring contact are dimensioned to receive a 0.025 inch square pin.

12. The probe tip adapter as recited in claim 1 wherein the electrically conductive element has an outwardly extending rib formed on the bore end of the element that engages the bore of the holder.

13. The probe tip adapter as recited in claim 1 wherein the measurement probe is a differential probe having first and second probing tips extending from the measurement probe and the probe tip adapter further comprising a second electrically conductive element having electrically conductive elastomer disposed in the bore and the element holder further comprising a second bore formed in the holder extending to the cavity and aligned with the second probing tip with the second electrically conductive element positioned in the second holder bore such that the second probing tip penetrates the elastomer of the second electrically conductive element and the probing contact of the second element extends from the holder.

14. The probe Up adapter as recited in claim 13 wherein each of the electrically conductive element further comprise a first portion associated with the bore end of the element and a second portion associated with the probing contact end of the element with each portion having a perimeter with the perimeter of the first portion being smaller than the perimeter of the second portion forming an outward extending shoulder from the first portion for abutting against the holder.

15. The probe tip adapter as recited in claim 14 wherein the second portion of the probing contact comprises a probing tip having a shaft that tapers at one end to a point and the other end that forms a cone extending outward from the shaft having a perimeter larger than the perimeter of the first portion.

16. The probe Up adapter as recited in claim 15 wherein the shaft of the probing is angled.

17. The probe tip adapter as recited in claim 16 wherein the angled probe tips of the first and second electrically conductive elements are laterally movable from at least a first position having a first pitch geometry to a second position having a second pitch geometry.

18. The probe tip adapter as recited in claim 1 wherein the element holder further comprises a mechanical attachment facility including at least a first pair of nesting detent elements disposed in the cavity and measurement probe with one of the nesting detent elements formed in the cavity and the other of the nesting detent elements formed on the measurement probe.

19. The probe tip adapter as recited in claim 18 wherein the pair of nesting detent elements comprise a knob and a depression.

20. The probe tip adapter as recited in claim 18 wherein the pair of nesting detent elements comprise a rib and a slot.

* * * * *